(12) United States Patent
Kwon

(10) Patent No.: US 6,539,525 B1
(45) Date of Patent: Mar. 25, 2003

(54) LAYOUT VERIFYING METHOD FOR INTEGRATED CIRCUIT DEVICE

(75) Inventor: Yong-hun Kwon, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 68 days.

(21) Appl. No.: 09/680,895

(22) Filed: Oct. 6, 2000

(30) Foreign Application Priority Data

Oct. 6, 1999 (KR) .............................................. 99-43055

(51) Int. Cl.$^7$ ................................................ G06F 17/50
(52) U.S. Cl. ................................................ 716/5; 716/4
(58) Field of Search ...................................... 716/1–14

(56) References Cited

U.S. PATENT DOCUMENTS

| | | | | |
|---|---|---|---|---|
| 5,101,122 A | * | 3/1992 | Shinonara ................ | 326/44 |
| 5,933,369 A | * | 8/1999 | Johnson et al. .......... | 365/189 |
| 6,009,253 A | * | 12/1999 | Srivatsa et al. .......... | 716/6 |
| 6,121,646 A | * | 9/2000 | Higuchi et al. ........... | 257/213 |
| 6,181,174 B1 | * | 1/2001 | Fujieda et al. ........... | 327/158 |
| 6,237,133 B1 | * | 5/2001 | Suzuki ...................... | 716/19 |
| 6,255,845 B1 | * | 7/2001 | Wong et al. .............. | 326/38 |

* cited by examiner

*Primary Examiner*—Vuthe Siek
*Assistant Examiner*—Sun James Lin
(74) *Attorney, Agent, or Firm*—Harness Dickey & Pierce, PLC

(57) ABSTRACT

A method of verifying the layout of an integrated circuit device is provided. In a method of verifying the layout of an integrated circuit device having a memory block, a dummy circuit for receiving and outputting signals which are applied to the input and output ports included in the memory block, is inserted into the memory block. Then, the integrated circuit device is placed and routed using a computer. Next, a circuit-to-layout verification is performed with respect to the integrated circuit device, using a computer. Thus, the time for layout data verification with respect to the integrated circuit device is shortened and the verification made more accurate.

13 Claims, 2 Drawing Sheets

LAYOUT VERIFYING METHOD FOR INTEGRATED CIRCUIT DEVICE

BACKGROUND OF THE INVENTION

1. Field of the Invention

The present invention relates to integrated circuit devices, and more particularly, to a method of verifying the layout of an integrated circuit device including a memory block and a logic block.

2. Description of the Related Art

Generally, application specific integrated circuit (ASIC) products are designed using the following five steps: 1) system option determination; 2) schematic circuit design of a circuit which performs a related function; 3) circuit verification; 4) placing/routing and layout verification; and 5) mask fabrication.

In the placing/routing of step 4), circuit elements on a net list, which is extracted in the schematic circuit design step, are realized as a layout of geometrical polygons and interconnections. In the layout verification of step 4), a net list is extracted from the layout expressed with polygons and interconnections, in contrast to the layout generation, and the extracted net list is compared to the original net list.

In the ASIC design industry, designs or layouts of functional blocks that are repeatedly used in integrated circuits are often copyrighted and commercialized. A vendor can then provide the functional block designs to other companies, and products can be manufactured using the designs and process of the vendor. Generally in these situations, the input and output characteristics, operation model, etc. of the functional blocks are provided to facilitate product design. The company using the functional block design processes an area containing the functional block, as a black box that includes only input and output terminals and does not include internal circuits. The company then performs the above designing step of placing/routing and layout verification. Finally, the mask information of the purchased design is inserted into the black box upon the manufacture of a mask. The use of a black box prevents circuit-level information from leaking to other companies and protects the vendor's technology.

In the placing/routing process of ASIC design including a black box, the interconnections between functional blocks are drawn to be connected up to the input and output terminals of the black boxes, since the black box includes no circuits for laying-out, as described above. At this time, a specific character is positioned at the ends of the interconnection shown up to the input and output terminals to help verify the layout later.

The verification of the layout is performed with respect to all areas except for the black box areas. At this time, it is impossible to check whether the layout has been shown such that the input and output terminals of the black box are properly connected to the interconnection. Merely indirect verification is made by checking the specific character at the ends of the interconnection which is connected to the input and output terminals.

Hence, even if computers analyze a layout and determine that there are no errors in the layout, it cannot be determined whether the layout of the input and output terminals of the black box and the interconnection have been properly drawn. At present, the connections to the input and output terminals of the black box are checked with the naked human eye after layout verification. This visual inspection may increase the designing time. Even with an entire circuit corresponding to the black box, when the circuit of the black box is as large as a memory core, verifying a layout can take a considerable amount of time. Furthermore, this visual inspection may generate errors. These drawing errors cause inferior products, for example, by failing to electrically connect a memory core portion to the input and output terminals of a product.

For these reasons, what is needed is an efficient and quick method for accurately generating and verifying an integrated circuit device layout having a black box area.

SUMMARY OF THE INVENTION

One aspect of the present invention is to provide a method of verifying the layout of an integrated circuit device, by which electrical disconnection between a plurality of ports and a memory core area can be accurately detected upon verification of a circuit to the layout. In this aspect of the present invention, a method is provided for generating and verifying the layout of an integrated circuit device having a black box area. The method includes: inserting a dummy circuit into the black box area; simultaneously placing and routing the integrated circuit device including the black box area, using a computer; and automatically verifying the connection between the input and output terminals of the back box area and a routing metal when the integrated circuit device is subjected to circuit-to-layout verification by a computer.

Preferably, a memory core is disposed in the black box area, and the dummy circuit is a logic gate tree circuit having a plurality of logic gates. The dummy circuit is preferably designed before the dummy circuit is first applied to the black box area and placed and routed.

In accordance with another aspect of the present invention, a method of verifying the layout of an integrated circuit device prevents metal traces from penetrating into a memory core region upon placing and routing. The method includes: arranging a plurality of blockages one by one between adjacent input and output ports in the memory block; simultaneously placing and routing the integrated circuit device using a computer; and performing a design rule check on the integrated circuit device which has been placed and routed using a computer.

Preferably, each of the blockages is between two adjacent input and output ports which have a wide interval therebetween. Verification of a circuit layout is performed after placing and routing the integrated circuit device. Also, the blockages are preferably made of metal and are processed as additional cells and skipped upon the manufacture of a final pattern generator.

In a third aspect of the present invention, a method accurately generates and verifies the layout of an integrated circuit device having a memory block by using a dummy circuit. The method includes: inserting a dummy circuit into the memory block and arranging a plurality of blockages one by one between adjacent input and output ports in the memory block; simultaneously placing and routing the integrated circuit device, using a computer; and performing a design rule check and a circuit-to-layout verification with respect to the integrated circuit device which has been placed and routed, using a computer.

These and other features and advantages of the present invention will be more readily apparent from the detailed description of the embodiments set forth below taken in conjunction with the accompanying drawings.

BRIEF DESCRIPTION OF THE DRAWINGS

The above features and advantages of the present invention will become more apparent by describing in detail an exemplary embodiment thereof with reference to the attached drawings in which.

The use of the same reference symbols in different drawings indicates similar or identical items.

DETAILED DESCRIPTION OF THE INVENTION

Hereinafter, exemplary embodiments of the present invention will be described in detail with reference to the attached drawings. However, the embodiments of the present invention can be modified into various other forms, and the scope of the present invention must not be interpreted as being restricted to the exemplary embodiments.

Figure 1:
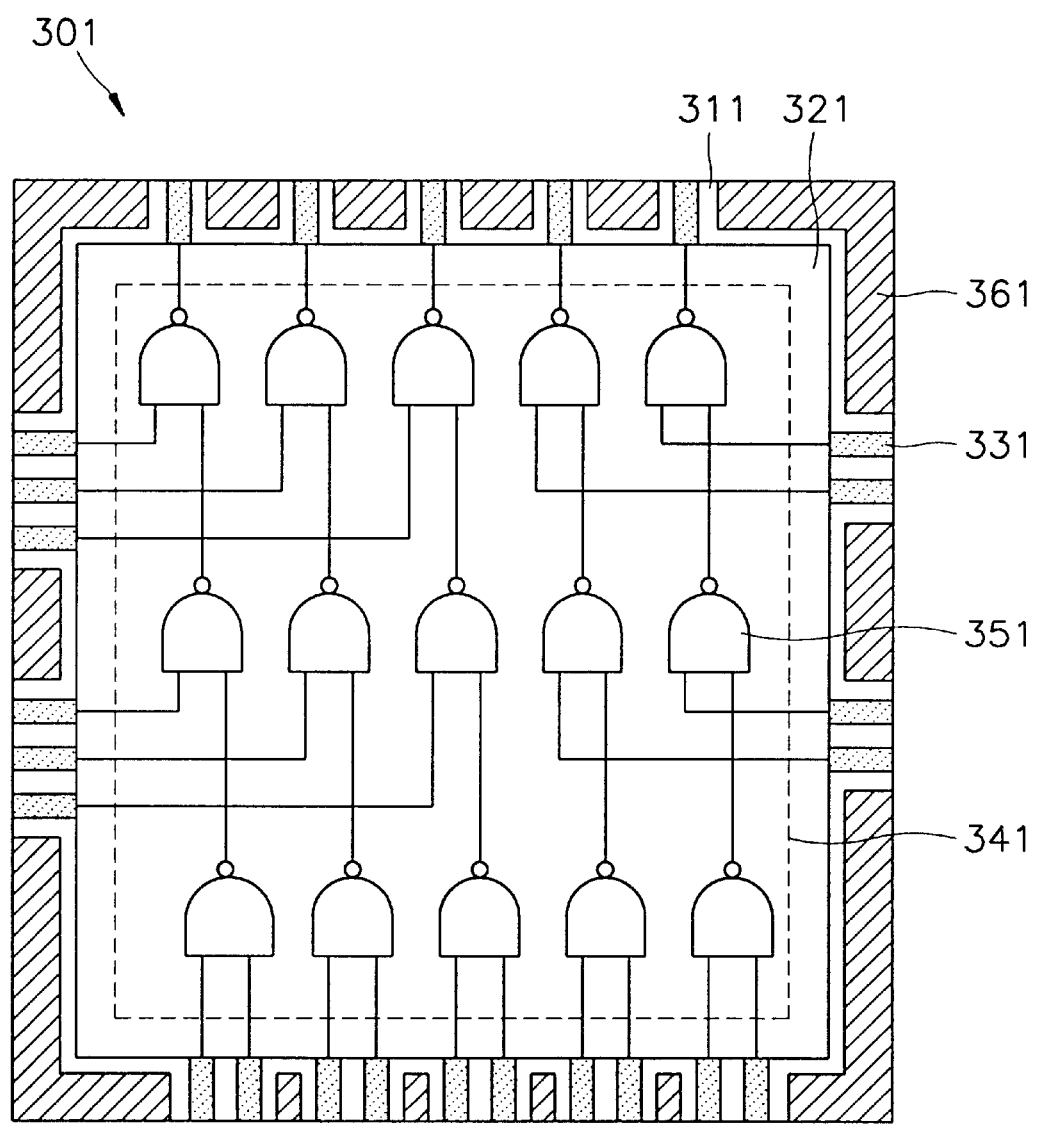
FIG. 1 is a view illustrating a memory block which is processed as a black box in an integrated circuit, according to an embodiment of the present invention.

Referring to FIG. 1, a memory block 301 includes an input and output area 311 of a memory circuit, and a memory core area 321, which is the area of the memory circuit other than input and output area 311. A plurality of input and output ports 331 are arranged in input and output area 311, and a plurality of blockages 361 are also arranged therein as necessary between the input and output areas 311. Power ports and ground ports are included in the plurality of input and output ports 331. Memory core area 321 is illustrated as including a dummy circuit 341, which is a logic gate tree circuit having a plurality of logic gates, for example, a plurality of NAND gates 351. All input and output ports 331 connect to the inputs and outputs of NAND gates 351. Dummy circuit 341 is used in a pre-layout process as a replacement for the core that will actually be present in the final layout of the integrated circuit. For example, dummy circuit 341 can be used in place of an actual memory circuit to be realized in memory block 301. When dummy circuit 341 is initially applied to an integrated circuit device, an additional placing and routing process must be performed on dummy circuit 341, so a predetermined amount of time is required. However, after this process, automated full chip verification can be completed while maintaining a turn around time (TAT), similar to that of a conventional method. Also, when the same dummy circuit 341 is applied many times for memory blocks, more improvement is possible.

When the entire integrated circuit is placed and routed, a dummy circuit within a black box area is also placed and routed. Thus, dummy circuit 341 in memory core area 321, the circuits in other function blocks, and the metal interconnections between function blocks are simultaneously drawn during placing and routing.

Verification of a circuit layout, including dummy circuit 341 within memory core area 321 in a black box area, can then be executed such that the interconnection between the black box area and its input and output terminals can be automatically verified. Connection is precisely checked to determine whether memory core area 321 and the interconnection between other function blocks have been drawn according to a circuit, so that signal connection and signal disconnection are accurately verified.

Dummy circuit 341 shown in FIG. 1 may alternatively include OR gates, NOR gates and AND gates, or a combination of these gates with or without the NAND gates. Preferably, the gate circuits in dummy circuit 341 are simple enough that the increase in time due to placing and routing of a dummy circuit can be disregarded.

In FIG. 1, blockages 361 are arranged between input and output ports 331, and each blockage 361 is in a wide space between adjacent input and output ports. This arrangement of blockages 361 between input and output ports 331 prevents routing metal from penetrating into memory core area 321 during placing and routing. Preferably, blockages 361 are made of metal. Also, blockages 361 prevent part of the routing metal which passes parallel to memory core area 321, from approaching any regions other than input and output ports 331. Thus, spacing and short phenomenon defects can be eliminated using a design rule that prevents routing too near blockages 361. For example, when the routing metal closely approaches buffer area 311, a set distance of 0.5 μm between routing metal and buffer area 311 can be treated as a defect in violation of required spacing upon checking the design rule.

When the placing and routing is performed using a computer, buffer area 311, on which blockages 361 and input and output ports 331 are disposed, is formed as a dummy cell, and dummy circuit 341 is formed as another dummy cell. The two dummy cells are overlaid one over the other, converted into flat data by smash option, and then used. This can be applied to all types of placing and routing tools, and can also be directly applied without conversion when the layout of an integrated circuit device is verified, thereby accomplishing perfect verification on a real memory cell. Upon the manufacture of a final pattern generator, the two dummy cells are skipped and the actual patterns required for the memory block are left in memory core area 321.

Figure 2:
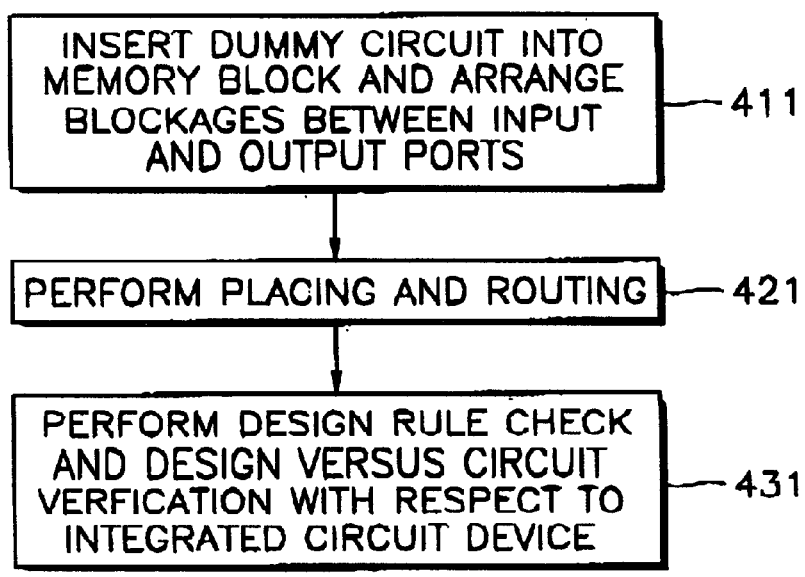
FIG. 2 is a flowchart illustrating a method of verifying the layout of an integrated circuit device, according to the present invention.

FIG. 2 is a flowchart illustrating a method of verifying the layout of an integrated circuit device, according to the present invention. Referring to FIGS. 1 and 2, in a step 411 dummy circuit 341 is inserted into memory block 301, and each of the blockages 361 is arranged between adjacent input and output ports 331 having a large interval therebetween. Before dummy circuit 341 is first applied to memory block 301, it is designed so that it receives and outputs every signal for receiving and outputting at input and output ports 331 of the actual memory block to be ultimately employed.

In step 421, a computer places and routes an integrated circuit device including the dummy circuit 341.

In step 431, the integrated circuit device, which has been placed and routed using a computer, is subjected to a design rule check and a circuit-to-layout verification.

According to the present invention as described above, when the integrated circuit device is placed and routed using a computer, the presence of blockages 361 prevent a routing metal which passes parallel to memory core area 321 from being arranged too close to memory core area 321 or from penetrating into memory core area 321. Therefore, the defect rate of the integrated circuit device is reduced. Furthermore, a visual inspection of the connection states of input and output ports, which is required when a conventional black box method is used, is eliminated. This omission of the visual inspection shortens the time for verification of a circuit layout and improves the accuracy of the circuit-to-layout verification.

Although the invention has been described with reference to particular embodiments, it will be apparent to one of ordinary skill in the art that modifications of the described embodiments may be made without departing from the spirit and scope of the invention. Various other adaptations and combinations of features of the embodiments disclosed are within the scope of the invention, as defined by the following claims.

What is claimed is:

1. A method of generating and verifying a layout of an integrated circuit device having a black box area, the method comprising:

inserting a dummy circuit into the black box area, wherein the black box area has predetermined fixed dimensions and a predetermined fixed number of input and output terminals associated with a functional unit to be integrated in the integrated circuit device;

placing and routing the integrated circuit device including the dummy circuit in the black box area; and automatically verifying connections between the input and output terminals of the black box area and a routing metal when the integrated circuit device is subjected to circuit-to-layout verification.

2. The method of claim 1, wherein a memory core is disposed on the black box area.

3. The method of claim 1, wherein the dummy circuit is a logic gate tree circuit having a plurality of logic gates.

4. The method of claim 1, wherein the dummy circuit is further designed before inserting the dummy circuit into the black box area.

5. The method of claim 1, further comprising replacing The dummy circuit with au actual circuit in the layout.

6. The method of claim 1, wherein a computer performs the placing, routing, and verifying.

7. The method of claim 1, further comprising arranging a plurality of blockages one by one between adjacent input and output ports of the dummy circuit.

8. A method of generating and verifying a layout of an integrated circuit device having a memory block, the method comprising:

arranging a plurality of blockages one by one between adjacent input and output ports in the memory block;

simultaneously placing and routing The integrated circuit device; and performing a design rule check on the integrated circuit device which has been placed and routed.

9. The method of claim 8, wherein each of the blockages is between two of the adjacent input and output ports which have a wide interval therebetween.

10. The method of claim 8, further comprising performing verification of circuit to the layout after placing and routing the integrated circuit device.

11. The method of claim 8, wherein the blockages correspond to metal regions.

12. The method of claim 8, wherein the blockages are processed as additional cells and skipped upon The manufacture of a final pattern generator.

13. A method of generating and verifying a layout of an integrated circuit device having a memory block, the method comprising:

inserting a dummy circuit into the memory block and arranging a plurality of blockages one by one between adjacent input and output ports in the memory block;

simultaneously placing and routing the integrated circuit device, using a computer; and performing a design rule check and a circuit-to-layout verification with respect to the integrated circuit device which has been placed and routed, using a computer.

* * * * *